(12) United States Patent
Matsunaga et al.

(10) Patent No.: US 11,851,752 B2
(45) Date of Patent: Dec. 26, 2023

(54) METHOD FOR FORMING SILICON FILM AND PROCESSING APPARATUS

(71) Applicant: Tokyo Electron Limited, Tokyo (JP)

(72) Inventors: Akari Matsunaga, Yamanashi (JP); Yutaka Motoyama, Yamanashi (JP); Satoshi Takagi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/654,139

(22) Filed: Mar. 9, 2022

(65) Prior Publication Data

US 2022/0307128 A1  Sep. 29, 2022

(30) Foreign Application Priority Data

Mar. 29, 2021 (JP) .................................. 2021-055962

(51) Int. Cl.
*C23C 16/24* (2006.01)
*H01L 21/02* (2006.01)
*C23C 16/455* (2006.01)
*C23C 16/52* (2006.01)

(52) U.S. Cl.
CPC ........ *C23C 16/24* (2013.01); *C23C 16/45563* (2013.01); *C23C 16/52* (2013.01); *H01L 21/02532* (2013.01)

(58) Field of Classification Search
CPC ... C23C 16/24; C23C 16/45563; C23C 16/52; H01L 21/02532
See application file for complete search history.

(56) References Cited

U.S. PATENT DOCUMENTS

2015/0275362 A1* 10/2015 Jang .................... C23C 16/4585
                                                                 118/728
2018/0158832 A1*  6/2018 Li ...................... H01L 29/66825
2019/0127852 A1*  5/2019 Fang ................. C23C 16/45502

FOREIGN PATENT DOCUMENTS

JP          2003209099 A   *  7/2003
JP          2016-192528        11/2016

OTHER PUBLICATIONS

JP2003209099A English translation (Year: 2023).*

* cited by examiner

*Primary Examiner* — Hai Y Zhang
(74) *Attorney, Agent, or Firm* — IPUSA, PLLC.

(57) ABSTRACT

A method for forming a silicon film includes supplying a first processing gas including a silicon-containing gas to a substrate to deposit a first silicon film under a first processing condition; and supplying a second processing gas including the silicon-containing gas to the substrate to deposit a second silicon film under a second processing condition. A second in-plane distribution of film characteristic when the second silicon film is deposited under the second processing condition is different from a first in-plane distribution of the film characteristic when the first silicon film is deposited under the first processing condition.

9 Claims, 10 Drawing Sheets

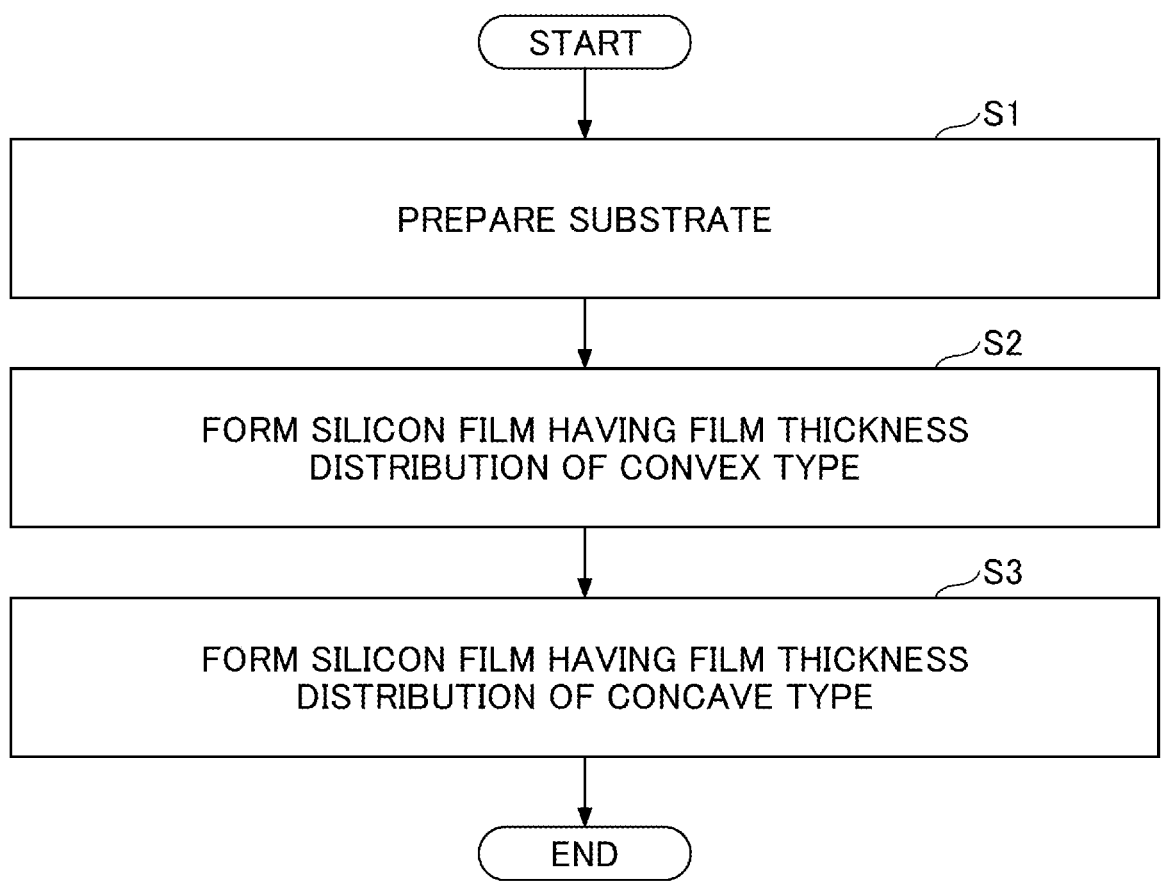

METHOD FOR FORMING SILICON FILM AND PROCESSING APPARATUS

CROSS-REFERENCE TO RELATED APPLICATION

The present application claims priority under 35 U.S.C. § 119 to Japanese Patent Application No. 2021-055962, filed Mar. 29, 2021, the contents of which are incorporated herein by reference in their entirety.

BACKGROUND OF THE INVENTION

1. Field of the Invention

The disclosures herein generally relate to a method for forming a silicon film and a processing apparatus therefor.

2. Description of the Related Art

Techniques for supplying disilane ($Si_2H_6$) from a side of a wafer to form a silicon film on the wafer have been known (See, for example, Japanese Unexamined Patent Application Publication No. 2016-192528).

SUMMARY OF INVENTION

Problem to be Solved by the Invention

The present disclosure provides a technique for controlling an in-plane distribution of film characteristic of a silicon film.

Means for Solving the Problem

According to an aspect of the present disclosure, a method for forming a silicon film includes supplying a first processing gas including a silicon-containing gas to a substrate to deposit a first silicon film under a first processing condition; and supplying a second processing gas including the silicon-containing gas to the substrate to deposit a second silicon film under a second processing condition. A second in-plane distribution of film characteristic when the second silicon film is deposited under the second processing condition is different from a first in-plane distribution of the film characteristic when the first silicon film is deposited under the first processing condition.

Effects of the Invention

According to the disclosure of the present application, an in-plane distribution of film characteristic of a silicon film can be controlled.

BRIEF DESCRIPTION OF DRAWINGS

FIG. 4 is a flowchart illustrating an example of a method of forming a silicon film according to the embodiment;

DESCRIPTION OF THE PREFERRED EMBODIMENTS

Figure 1:
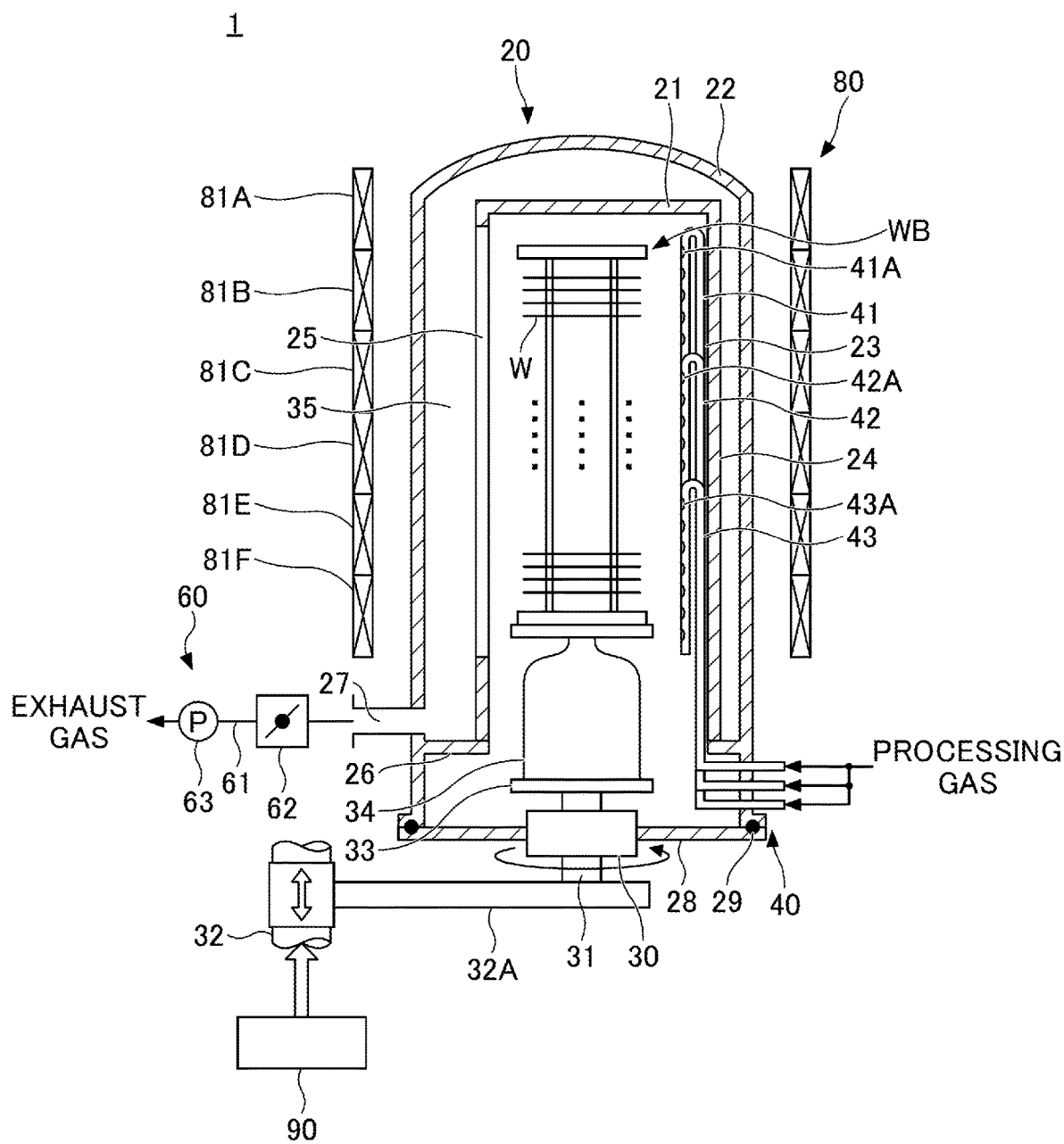
FIG. 1 is a schematic view depicting an example of an overall configuration of a processing apparatus according to an embodiment of the present application.

Hereinafter, non-limiting exemplary embodiments of the present disclosure will be described with reference to the accompanying drawings. In all the accompanying drawings, the same or corresponding reference numerals are assigned to the same or corresponding members or components, and the description may be omitted.

Processing Apparatus

Figure 2:
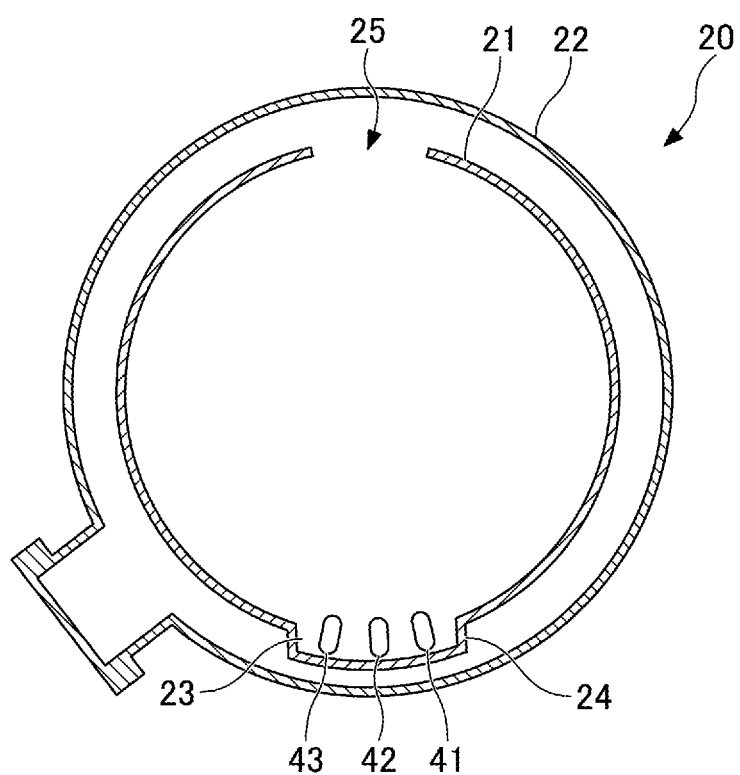
FIG. 2 is a diagram illustrating an example of a processing chamber in the processing apparatus shown in FIG. 1.
Figure 3:
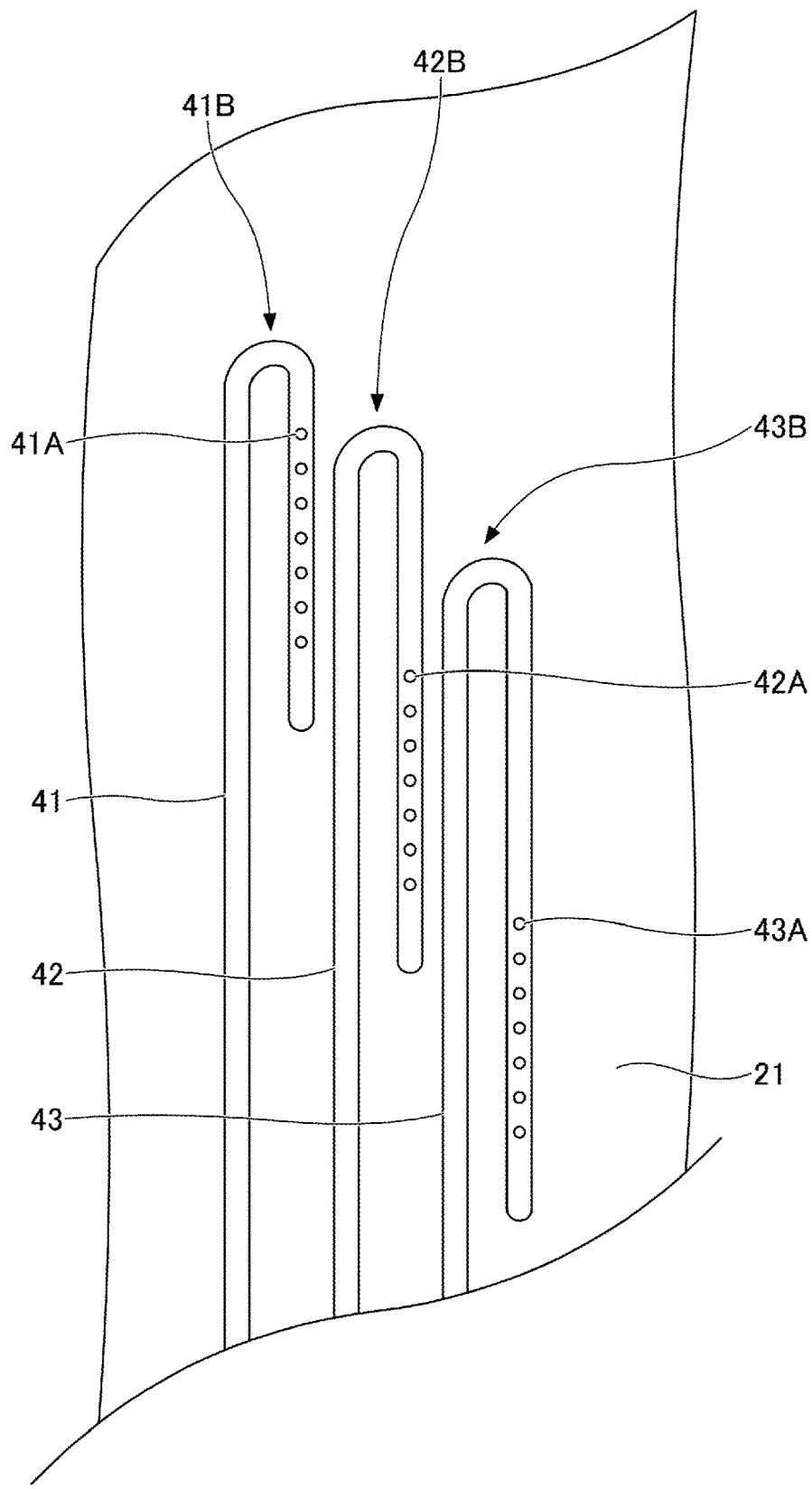
FIG. 3 is a diagram illustrating an example of a gas supply section in the processing apparatus shown in FIG. 1.

Referring to FIGS. 1 to 3, an example of a processing apparatus according to an embodiment of the present application will be described. FIG. 1 is a schematic view depicting an example of an overall configuration of the processing apparatus according to the embodiment. FIG. 2 is a diagram illustrating an example of a processing chamber in the processing apparatus shown in FIG. 1. FIG. 3 is a diagram illustrating an example of a gas supply section in the processing apparatus shown in FIG. 1.

A processing apparatus 1 includes a processing chamber 20, a gas supply 40, an exhaust section 60, a heating section 80, and a controller 90.

The processing chamber 20 accommodates a boat WB. A boat WB holds a plurality of substrates W at a predetermined interval in a vertical direction. The substrate W may be, for example, a semiconductor wafer. The processing chamber 20 includes an inner tube 21 and an outer tube 22. The inner tube 21 is formed in a topped cylindrical shape having an open lower end. A ceiling of the inner tube 21 is formed, for example, flat. The outer tube 22 is formed in a topped cylindrical shape that covers the outside of the inner tube 21 having an open lower end. That is, the upper portion of the outer tube 22 is closed. The inner tube 21 and the outer tube 22 are arranged coaxially to form a dual tube structure. The inner tube 21 and the outer tube 22 are formed of a heat resistant material such as quartz.

A nozzle storage section 23 is formed on one side of the inner tube 21 to accommodate gas nozzles along a longitudinal direction (a vertical direction). For example, as shown in FIG. 2, the nozzle storage section 23 is formed in a convex section 24, which is formed by protruding a portion of a side wall of the inner tube 21 outwardly. A rectangular opening 25 is formed along the longitudinal direction (the vertical direction) in the side wall of the inner tube 21 opposite to the nozzle storage section 23.

The opening 25 is a gas exhaust port configured to evacuate the gas in the inner tube 21. The vertical length of the opening 25 is set to be the same as the vertical length of the boat WB, or the opening 25 is formed to extend both upwardly and downwardly longer than the vertical length of the boat WB. That is, an upper end of the opening 25 is located at a position that extends to a height greater than or equal to that of a position corresponding to an upper end of the boat WB, and a lower end of the opening 25 is located at a position that extends to a height less than or equal to that of a position corresponding to a lower end of the boat WB.

A support 26 having an annular shape is provided on an inner wall of a lower portion of the outer tube 22. The support 26 supports the lower end of the inner tube 21. A gas outlet 27 is formed above the support 26 on the side wall of the outer tube 22. To an opening at the lower end of the outer tube 22, a lid 28 is airtightly mounted via a sealing member 29 such as an O-ring so as to airtightly seal an opening at the lower end of the processing chamber 20. The lid 28 is configured to open and close the opening. The lid 28 is formed, for example, of stainless steel.

At the center of the lid 28, a rotating shaft 31 is provided through a magnetic fluid seal 30. A lower portion of the rotating shaft 31 is rotatably supported by an arm 32A of a lifting means 32 including a boat elevator.

A rotating plate 33 is provided at an upper end of the rotating shaft 31. The boat WB is placed on the rotating plate 33 via a heat insulating table 34 formed of quartz. Accordingly, the lid 28 and the boat WB are moved up and down by elevating and descending the lifting means 32, so that the boat WB is inserted into and removed from the processing chamber 20.

The gas supply 40 introduces a predetermined gas into the processing chamber 20. The gas supply 40 is disposed at the lower portion of the outer tube 22, and introduces the predetermined gas into the inner tube 21. The gas supply 40 has a plurality of (e.g., three) gas nozzles 41, 42, and 43.

The gas nozzles 41, 42, and 43 are formed, for example, by quartz tubes having a circular cross-section. Gas nozzles 41, 42, and 43 are positioned in a row along a circumferential direction in the nozzle storage section 23 of the inner tube 21. On the base end side, the gas nozzles 41, 42, and 43 are connected to the inner wall of the outer tube 22, for example, and on the distal end side, the gas nozzles are closed. The gas nozzles 41, 42, and 43 are formed to bend in an L-shape so as to extend inwardly from the inner wall of the outer tube 22 and rise vertically upwardly along the inner wall of the inner tube 21, and formed so that distal ends of the gas nozzles rising upwardly bend downwardly and extend vertically. In the examples illustrated in the drawings, the gas nozzles 41, 42, and 43 are formed so as to bend toward the inside of the inner tube 21. However, the gas nozzles 41, 42, and 43 may be formed so as to bend along the circumferential direction of the inner tube 21, for example. Moreover, the gas nozzles 41, 42, and 43 may be provided so as to rise vertically upward along the inner wall of the inner tube 21 without bending the distal ends thereof.

The gas nozzles 41, 42, and 43 are formed so that bending parts 41B, 42B, and 43B thereof are located at different height positions. For example, the gas nozzle 41 bends above the ceiling of the boat WB. WB. The gas nozzle 43 is provided so that the gas nozzle 43 bends above the distal end of the gas nozzle 41 and the distal end of the gas nozzle 43 is located below the wafer boat WB, for example. The gas nozzle 42 bends at a height between those of the bending parts 41B and 43B of the gas nozzles 41 and 43, and the distal end of the gas nozzle 42 is located between the distal ends of the gas nozzles 41 and 43, for example. The shapes of the bending parts 41B, 42B, and 43B of the gas nozzles 41, 42, and 43 are the same, for example. The gas nozzles 41, 42, and 43 are arranged so that, for example, distances between the gas supply tubes on the downstream side of the bending parts 41B, 42B, and 43B and an outer edge (extrapolation line) of substrates W held in the boat WB are the same.

Gas discharge holes 41A, 42A, and 43A are formed in the gas nozzles 41, 42, and 43 on the distal end side of the bending parts 41B, 42B, and 43B, respectively. The gas discharge holes 41A, 42A, 43A, for example, are circularly shaped of the same size, and are formed, for example, equally spaced in the longitudinal direction of the gas nozzles 41, 42, and 43. Each of the gas discharge holes 41A, 42A, and 43A discharges gas horizontally toward the boat WB. That is, gas is supplied from a side direction of the plurality of substrates W mounted on the boat WB. In addition, since the height positions of the bending parts 41B, 42B, and 43B are different, the positions in the vertical direction of the gas discharge holes 41A, 42A, and 43A are different from one another among the gas nozzles 41, 42, and 43. In this manner, the gas discharge holes 41A, 42A, and 43A supply gas to a plurality of regions of the processing chamber 20 in which the substrates W are arranged, which are divided in the vertical direction, respectively. In the illustrated example, the gas discharge hole 41A supplies gas to an upper area of the boat WB, the gas discharge hole 42A supplies gas to a central area of the boat WB, and the gas discharge hole 43A supplies gas to a lower area of the boat WB.

The predetermined gas includes, for example, a processing gas such as a deposition gas, an etching gas, or a cleaning gas. The deposition gas may include, for example, a silicon-containing gas such as monosilane ($SiH_4$), or disilane ($Si_2H_6$) and an additive gas such as hydrogen ($H_2$), or nitrogen ($N_2$) added to the silicon-containing gas. The predetermined gas also includes, for example, a purge gas to purge the processing gas. The predetermined gas is introduced into the processing chamber 20 from the gas nozzles 41, 42, and 43 under control for a flow rate thereof.

An exhaust section 60 evacuates gas in the processing chamber 20. The exhaust section 60 has an exhaust passage 61 connected to the gas outlet 27. A pressure regulating valve 62 and a vacuum pump 63 are sequentially interposed in the exhaust passage 61 to evacuate the inside of the processing chamber 20. The exhaust section 60 evacuates a gas in the inner tube 21 exhausted from the opening 25, for example, through a space 35 between the inner tube 21 and the outer tube 22.

A heating section 80 heats the substrate W accommodated in the processing chamber 20. The heating section 80 is formed in a cylindrical shape, for example, on the outer periphery of the outer tube 22 to cover the outer tube 22. The heating section 80 includes heaters 81A to 81F disposed, for example, from an upper side to a lower side of the heating section 80. Because the heating section 80 has the plurality of partitioned heaters 81A to 81F, temperatures can be controlled individually in the vertical direction. However, the heating section 80 may have a single undivided heater.

The controller 90 controls an operation of the entire apparatus. The controller 90 has a CPU (Central Processing Unit), a ROM (Read Only Memory), and a RAM (Random Access Memory). The CPU causes a desired heat treatment to be performed according to a recipe stored in a storage area such as the RAM. In the recipe, control information for the apparatus according to a process condition is set. The control information may be, for example, a gas flow rate, a pressure, a temperature, and a process time. A program used by the recipe and the controller 90 may be stored in a hard disk, or a semiconductor memory, for example. The recipe or the like may be set in a predetermined position to be read out in a state stored in a portable computer-readable storage medium such as a CD-ROM or a DVD. The controller 90 may be provided separately from the processing apparatus 1.

[Method of Forming Silicon Film]

Referring to FIGS. 4 to 6B, a method of forming a silicon film according to the embodiment will be described with reference to the example in which the method is performed in the above-described processing apparatus 1. However, the method of forming the silicon film according to the embodiment can be performed also in an apparatus that is different from the above-described processing apparatus 1.

As shown in FIG. 4, the method of forming the silicon film according to the embodiment includes preparing a substrate (step S1), forming a silicon film having a film thickness distribution of convex type (step S2), and forming a silicon film having a film thickness distribution of concave type (step S3).

Figure 5A:
FIGS. 5A to 5C are diagrams depicting cross sections of a silicon film for illustrating an example of processes of the method of forming the silicon film according to the embodiment.

In step S1, a substrate is prepared. In the present embodiment, as shown in FIG. 5A, a plurality of (e.g., 50 to 150) substrates W each including a base 101 are mounted in the boat WB, and the boat WB is inserted from below into the processing chamber 20, so that the plurality of substrates W are accommodated in the processing chamber 20. Subsequently, by closing the opening at the lower end of the outer tube 22 with the lid 28, a sealed space is formed in the processing chamber 20. In this state, the processing chamber 20 is evacuated and a predetermined vacuum atmosphere is maintained. Then, the supply power to the heaters 81A to 81F of the heating section 80 is controlled to increase a substrate temperature, and the substrate temperature is maintained at the process temperature. Furthermore, the boat WB is set to a state of rotating. The base 101 may be, for example, a $SiO_2$ film.

Figure 5B:
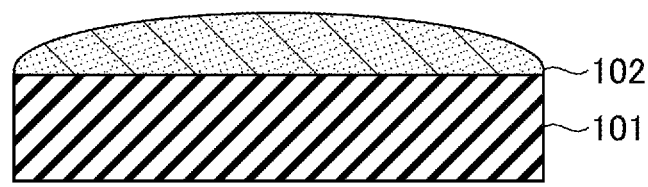
Figure 6A:
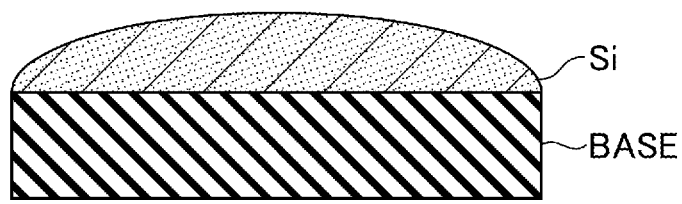
FIGS. 6A and 6B are diagrams depicting cross sections of silicon films for illustrating in-plane distributions of film thicknesses of the silicon films.

In forming a silicon film having a film thickness distribution of convex type (step S2), as shown in FIG. 6A, a silicon (Si) film having a film thickness distribution of convex type is formed on a base. The film thickness distribution of convex type is a distribution in which a film thickness of the central portion is greater than a film thickness of the peripheral portion of the substrate. In the present embodiment, the gas discharge holes 41A, 42A, and 43A supply a processing gas containing $Si_2H_6$ and not containing $H_2$, to form a silicon film 102 on the base 101 of each of the plurality of substrates W mounted on the boat WB. Thus, as shown in FIG. 5B, a silicon film 102 having a thickness distribution of convex type can be formed on the base 101.

Figure 5C:
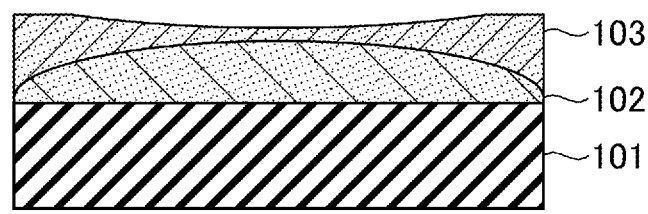
Figure 6B:
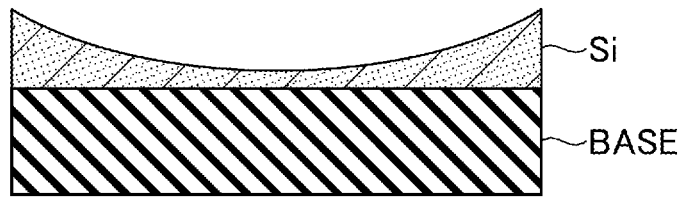

In forming a silicon film having a film thickness distribution of concave type (step S3), as shown in FIG. 6B, a silicon (Si) film having a film thickness distribution of concave type is formed on the base. The film thickness distribution of concave type is a distribution in which the film thickness of the central portion is less than the film thickness of the peripheral portion of the substrate. In the present embodiment, the gas discharge holes holes 41A, 42A, and 43A supply the processing gas containing $Si_2H_6$ and $H_2$ (an example of the additive gas), to form a silicon film 103 on the silicon film 102 of each of the plurality of substrates W mounted on the boat WB. Therefore, as shown in FIG. 5C, the silicon film 103, which is relatively thin in the central portion of the substrate W where the silicon film 102 is thick, and is relatively thick in the peripheral portion of the substrate W where the silicon film 102 is thin, is formed. As a result, a silicon film (the silicon film 102 and the silicon film 103) with a high in-plane uniformity in film thickness (with a uniform film thickness) can be formed.

As described above, according to the embodiment, the silicon film 102 having the film thickness distribution of convex type is formed on the base 101, and then the silicon film 103 having the film thickness distribution of concave type is formed on the silicon film 102. As a result, the silicon film 103, which is relatively thin in the central portion where the film thickness of the silicon film 102 is thick and is relatively thick in the peripheral portion where the film thickness of the silicon film 102 is thin, is formed. Thus, a silicon film (the silicon film 102 and the silicon film 103) with a high in-plane uniformity in film thickness can be formed.

Further, according to the embodiment, by controlling a ratio of the processing time of forming the silicon film having the film thickness distribution of convex type (step S2) to the processing time of forming the silicon film having the film thickness distribution of concave type (step S3), a desired ratio of the film thickness in the central portion of the substrate W to the film thickness in the peripheral portion can be obtained. For example, as the time of forming the silicon film having the film thickness distribution of convex type (step S2) is made relatively longer, the film thickness of the silicon film in the central portion of the substrate W relative to that in the peripheral portion can be made thicker. Moreover, for example, as the time of forming the silicon film having the film thickness distribution of concave type (step S3) is made relatively longer, the film thickness of the silicon film in the central portion of the substrate W relative to that in the peripheral portion can be made thinner. Thus, according to the embodiment, the in-plane distribution of the film thickness of the silicon film can be controlled.

In the above-described embodiment, the case in which the silicon film having the film thickness distribution of concave type is formed (step S3) after the silicon film having the film thickness distribution of convex type is formed (step S2) is described. However, the order of step S2 and step S3 is not limited to the above-described embodiment. For example, the silicon film having the film thickness distribution of convex type may be formed (step S2) after the silicon film having the film thickness distribution of concave type is formed (step S3). Furthermore, for example, forming the silicon film having the film thickness distribution of convex type (step S2), and forming the silicon film having the film thickness distribution of concave type (step S3) may be repeated alternately.

Moreover, in the above-described embodiment, the method of forming a silicon film including forming a silicon film having a film thickness distribution of convex type (step S2) and forming a silicon film having a film thickness distribution of concave type (step S3) has been described. However, the present disclosure is not limited thereto. The method of forming a silicon (nitride) film according to the present embodiment may include two or more steps of performing deposition of silicon films under processing conditions in which in-plane distributions of film thicknesses are different. For example, the method of forming a silicon film of the present embodiment may include two or more steps of performing under conditions in which types of processing gases are the same and flow rates of the processing gases are different. Moreover, for example, the method of forming a silicon film of the embodiment may include two or more steps of performing under conditions in which two or more of the type of processing gas, the flow rate of the processing gas, and the process pressure are different.

EXAMPLE

First, a practical example of evaluation of an in-plane uniformity of a film thickness of a silicon film formed by the method of forming a silicon film having two processes with different types of processing gases will be described with a comparative example.

In a first practical example, a silicon wafer having a diameter of 300 mm with a $SiO_2$ film formed on a surface was prepared. Next, in the above-described processing apparatus 1, by forming a silicon film having a film thickness distribution of convex type (step S2) and forming a silicon film having a film thickness distribution of concave type (step S3) in this order, a silicon film was formed on the $SiO_2$ film. Then, the film thickness of the silicon film formed on the $SiO_2$ film was measured at a plurality of positions within the plane of the silicon wafer, and an in-plane range of the film thickness of the silicon film was calculated based on the measured values. The in-plane range is a value obtained by subtracting the minimum value from the maximum value of the plurality of film thicknesses of the silicon film measured within the plane of the silicon wafer. The smaller the value of the in-plane range, the higher the in-plane uniformity.

The condition for step S2 in which the silicon film having the film thickness distribution of convex type is formed (the first processing condition) is as follows.

Processing gas: $Si_2H_6$ (300 sccm from each of the gas nozzles 41, 42, and 43);
Processing temperature: 380° C.;
Processing pressure: 360 Pa (2.7 Torr); and
Processing time: 39.6 minutes.

The condition for step S3 in which the silicon film having the film thickness distribution of concave type is formed (the second processing condition) is as follows.

Processing gas: $Si_2H_6$ (300 sccm from each of the gas nozzles 41, 42 and 43), and $H_2$ (1000 sccm from each of the gas nozzles 41, 42 and 43);
Processing temperature: 380° C.;
Processing pressure: 360 Pa (2.7 Torr); and
Processing time: 19.0 minutes.

In a second practical example, a silicon wafer having a diameter of 300 mm with a $SiO_2$ film formed on a surface was prepared. Next, in the above-described processing apparatus 1, by forming a silicon film having a film thickness distribution of concave type (step S3) and forming a silicon film having a film thickness distribution of convex type (step S2) in this order, a silicon film was formed on the $SiO_2$ film. Then, the film thickness of the silicon film formed on the $SiO_2$ film was measured at a plurality of positions within the plane of the silicon wafer, and the in-plane range of the film thickness of the silicon film was calculated based on the measured values. The conditions of step S2 (the first processing condition) for forming the silicon film having the film thickness distribution of convex type and the conditions of step S3 (the second processing condition) for forming the silicon film having the film thickness distribution of concave type were the same as the first processing condition and the second processing condition of the first practical example, respectively, except for the processing time. The processing time for step S3 of forming the silicon film having the film thickness distribution of concave type was 33.0 minutes, and the processing time for step S2 of forming the silicon film having the film thickness distribution of convex type was 33.5 minutes.

In a first comparative example, a silicon wafer having a diameter of 300 mm with a $SiO_2$ film formed on a surface was prepared. Next, in the above-described processing apparatus 1, only the silicon film having the film thickness distribution of convex type (step S2) was formed, so that a silicon film was formed on the $SiO_2$ film. Then, the film thickness of the silicon film formed on the $SiO_2$ film was measured at a plurality of positions within the plane of the silicon wafer, and the in-plane range of the film thickness of the silicon film was calculated based on the measured values. The condition (the first processing condition) of step S2 for forming the silicon film having the film thickness distribution of convex type was the same as the first processing condition of the first practical example, except for the processing time. The processing time for step S2 of forming the silicon film having the film thickness distribution of convex type was 50.0 minutes.

In a second comparative example, a silicon wafer having a diameter of 300 mm with a $SiO_2$ film formed on a surface was prepared. Next, in the above-described processing apparatus 1, only the silicon film having the film thickness distribution of concave type (step S3) was formed, so that a silicon film was formed on the $SiO_2$ film. Then, the film thickness of the silicon film formed on the $SiO_2$ film was measured at a plurality of positions within the plane of the silicon wafer, and the in-plane range of the film thickness of the silicon film was calculated based on the measured values. The condition (the second processing condition) of step S3 for forming the silicon film having the film thickness distribution of concave type was the same as the second processing condition of the first practical example, except for the processing time. The processing time for step S3 of forming the silicon film having the film thickness distribution of concave type was 120.0 minutes.

Figure 7:
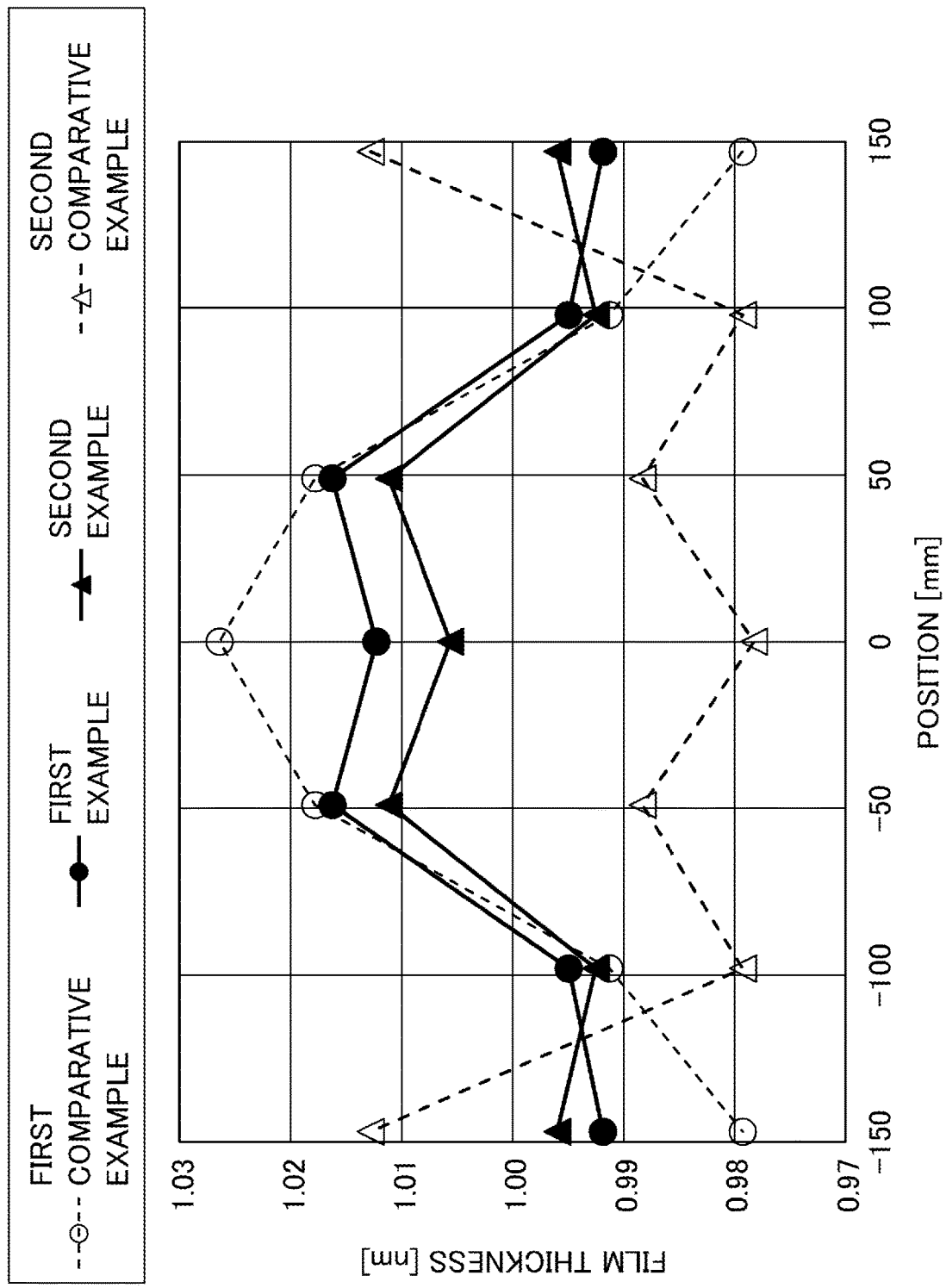
FIG. 7 is a diagram depicting an example of the in-plane distributions of the thicknesses of the silicon films in practical examples.

FIG. 7 is a diagram showing the in-plane distribution of the film thickness of the silicon film in the examples. FIG. 7 shows the results of the first practical example, the second practical example, the first comparative example, and the second comparative example. In FIG. 7, the horizontal axis indicates a position [mm] and the vertical axis indicates a film thickness [nm] of the silicon film. It should be noted that the wafer was centered at 0 mm and the outer edges of the wafer were −150 mm and 150 mm.

In FIG. 7, the first comparative example shows a convex-shaped distribution in which the film thickness of the central portion is greater than that of the peripheral portion of the wafer, and the second comparative example shows a concave-shaped distribution in which the film thickness of the central portion is less than that of the peripheral portion of the wafer. In contrast, in the first practical example and the second practical example, the film thickness of the central portion of the wafer is less than that in the first comparative example, and the film thickness of the peripheral portion of the wafer is less than that in the second comparative example. In the first practical example and the second practical example, the in-plane ranges were 2.05 Å and 1.64 Å, respectively. On the other hand, in the first comparative example and the second comparative example, the in-plane ranges were 2.85 Å and 2.19 Å, respectively.

From the above-described results, it was found that a silicon film having a small in-plane range can be formed by forming a silicon film having a film thickness distribution of convex type (step S2) and forming a silicon film having a film thickness distribution of concave type (step S3). That is, a silicon film having high in-plane uniformity is found to be formed by forming a silicon film having a film thickness distribution of convex type (step S2) and forming a silicon film having a film thickness distribution of concave type (step S3).

Next, results of evaluating the film thickness distribution of the silicon film when the flow rate and the processing pressure of $Si_2H_6$ are changed will be described.

First, a silicon wafer having a diameter of 300 mm with a $SiO_2$ film formed on the surface was prepared. Then, in the above-described processing apparatus 1, a silicon film was formed on the $SiO_2$ film of the prepared silicon wafer under a plurality of processing conditions. The processing conditions are as follows.

Processing gas: $Si_2H_6$;
Flow rate of $Si_2H_6$: 350 sccm, 600 sccm, and 900 sccm;
Processing temperature: 380° C.; and
Processing pressure: 133 Pa (1.0 Torr), 200 Pa (1.5 Torr), and 267 Pa (2.0 Torr).

The flow rate of $Si_2H_6$ of 350 sccm means a condition in which a flow rate of $Si_2H_6$ supplied from each of the gas nozzles 41, 42, and 43 was set to 116 sccm. The flow rate of $Si_2H_6$ of 600 sccm means a condition in which the flow rate of $Si_2H_6$ supplied from each of the gas nozzles 41, 42, and 43 was set to 200 sccm. The flow rate of $Si_2H_6$ of 900 sccm means a condition in which the flow rate of $Si_2H_6$ supplied from each of the gas nozzles 41, 42 and 43 was set to 300 sccm.

Figure 8:
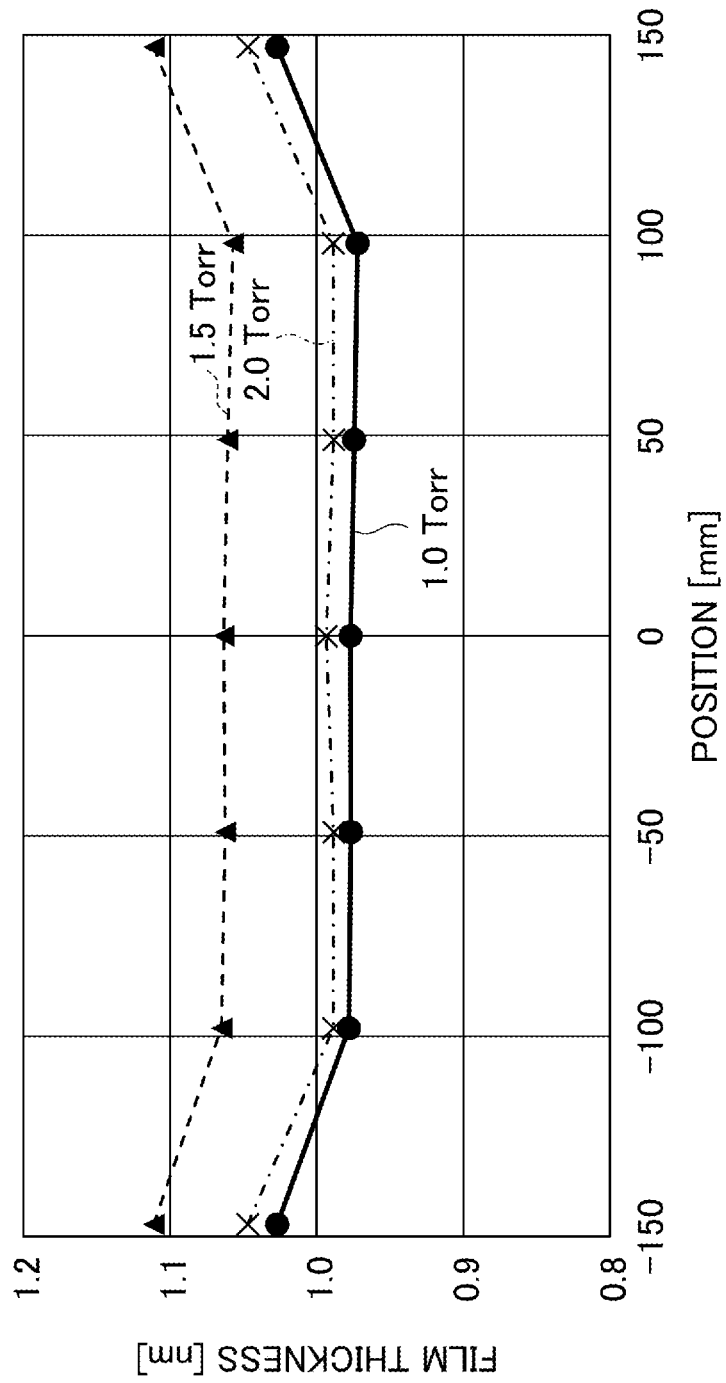
FIG. 8 is a diagram depicting an example of a relation between a flow rate of disilane ($Si_2H_6$), a processing pressure, and the film thickness distribution of the silicon film.
Figure 9:
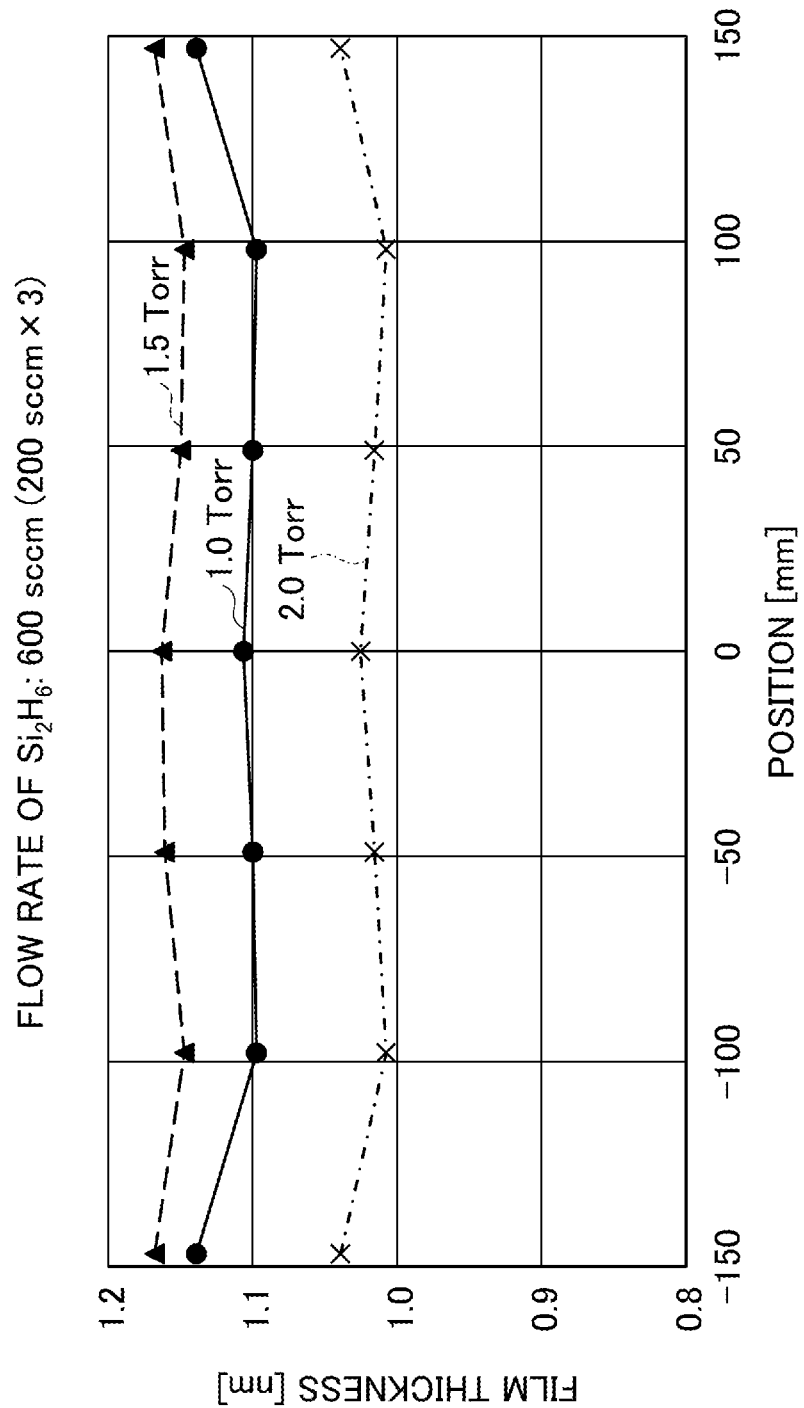
FIG. 9 is a diagram depicting another example of the relation between the flow rate of disilane, the processing pressure, and the film thickness distribution of the silicon film.
Figure 10:
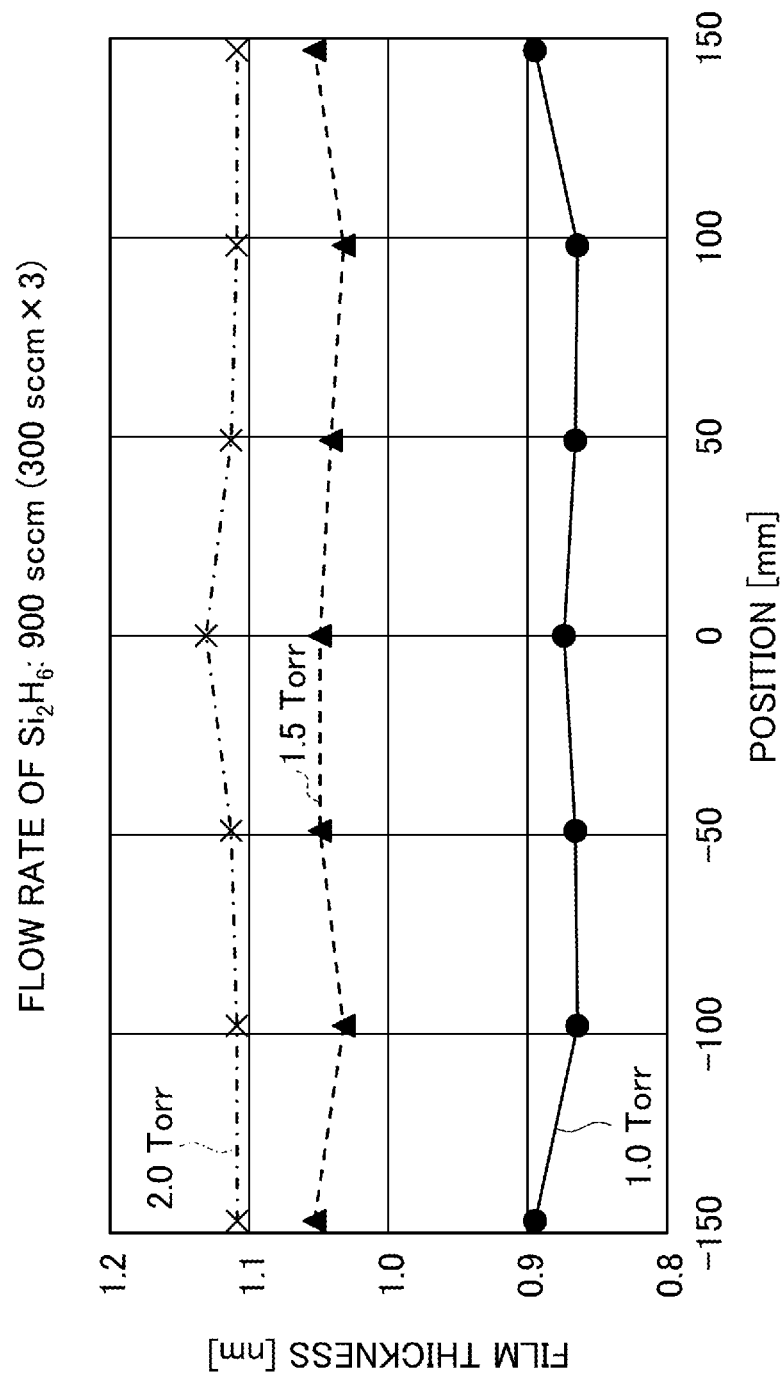
FIG. 10 is a diagram depicting yet another example of the relation between the flow rate of disilane, the processing pressure, and the film thickness distribution of the silicon film.

FIGS. 8 to 10 are diagrams showing a relationship between the flow rate of $Si_2H_6$, the processing pressure, and the film thickness distribution of the silicon film. FIGS. 8, 9, and 10 show processing pressure dependence of the film thickness distribution when the flow rates of $Si_2H_6$ were set to 350 sccm, 600 sccm, and 900 sccm, respectively. In FIGS. 8 to 10, the horizontal axis indicates a position [mm] and the vertical axis indicates a film thickness [nm] of the silicon film. It should be noted that the wafer was centered at 0 mm and the outer edges of the wafer were −150 mm and 150 mm.

As shown in FIG. 8, the in-plane distribution of the silicon film thickness is found to be able to be controlled by changing the flow rate of $Si_2H_6$ and the processing pressure. For example, by increasing the rate of $Si_2H_6$ (e.g., 900 sccm) and increasing the processing pressure (e.g., 2.0 Torr), a silicon film with a film thickness distribution of convex type can be formed.

Moreover, for example, by reducing the flow rate of $Si_2H_6$ (e.g., 350 sccm), a silicon film with a film thickness distribution of concave type can be formed, irrespective of the processing pressure.

Based on the above-described results, the in-plane distribution of the silicon film thickness is found to be able to be controlled by changing the flow rate of $Si_2H_6$ and the processing pressure.

The embodiments disclosed herein should be considered to be exemplary in all respects, and the present invention is not limited to the requirements shown in the embodiments. The above embodiments may be omitted, substituted, or modified in various forms without departing from the scope of appended claims and spirit thereof.

In the above-described embodiments, the case of controlling the in-plane distribution of the film thickness of the silicon film has been described. However, the present disclosure is not limited to the case. For example, the present disclosure can be applied also to the case of controlling an in-plane distribution of film characteristics other than the film thickness, such as a hydrogen concentration in a silicon film.

In the embodiments described above, the processing apparatus of batch type in which a plurality of substrates are processed simultaneously has been described. However, the present disclosure is not limited to the case. For example, a processing apparatus of sheet type in which substrates are processed one by one may be employed. Moreover, for example, a processing apparatus of semi-batch type may be used, in which a plurality of substrates disposed on a rotating table in a processing chamber are revolved by a rotating table, and the substrates are processed by passing through a region in which a first gas is supplied and a region in which a second gas is supplied in sequence.

What is claimed is:

1. A method for forming a silicon film comprising:
   supplying a first processing gas including a silicon-containing gas to a substrate to deposit a first silicon film; and
   supplying a second processing gas including the silicon-containing gas to the substrate to deposit a second silicon film,
   wherein the first processing gas contains the silicon-containing gas and does not contain $H_2$ gas,
   wherein the second processing gas contains both the silicon-containing gas and $H_2$ gas,
   wherein by the supplying of the first processing gas, the first silicon film has a first in-plane distribution of film characteristics, and
   wherein by the supplying of the second processing gas, the second silicon film has a second in-plane distribution of film characteristics different from the first in-plane distribution of film characteristics.

2. The method for forming a silicon film according to claim 1,
   wherein the first processing gas and the second processing gas are supplied from a side direction of the substrate.

3. The method for forming a silicon film according to claim 1,
   wherein the first silicon film is deposited under a first processing condition, and the second silicon film is deposited under a second processing condition, and
   wherein each of the first processing condition and the second processing condition includes a flow rate of the silicon-containing gas.

4. The method for forming a silicon film according to claim 1,
   wherein the first silicon film is deposited under a first processing condition, and the second silicon film is deposited under a second processing condition,
   wherein the substrate is accommodated in a processing chamber, and
   wherein each of the first processing condition and the second processing condition includes a pressure in the processing chamber when supplying the silicon-containing gas.

5. The method for forming a silicon film according to claim 1,
   wherein the first silicon film is deposited under a first processing condition, and the second silicon film is deposited under a second processing condition,
   wherein the film characteristic is a film thickness, and
   wherein each of the first processing condition and the second processing condition includes a condition in which a film thickness in a central portion of the substrate is greater than a film thickness in a peripheral portion of the substrate, or a condition in which the film thickness in the central portion of the substrate is less than the film thickness in the peripheral portion of the substrate.

6. The method for forming a silicon film according to claim 1,
wherein the silicon-containing gas is silane gas ($SiH_4$) or disilane gas ($Si_2H_6$).

7. The method for forming a silicon film according to claim 1 further comprising:
supplying, one or more times, the first processing gas including the silicon-containing gas to the substrate to deposit the first silicon film; and
supplying, one or more times, the second processing gas including the silicon-containing gas to the substrate to deposit the second silicon film.

8. The method for forming a silicon film according to claim 1,
wherein the first in-plane distribution of film characteristics is such that a film thickness in a central portion of the substrate is greater than a film thickness in a peripheral portion of the substrate, and
wherein the second in-plane distribution of film characteristics is such that a film thickness in the central portion of the substrate is less than a film thickness in the peripheral portion of the substrate.

9. A processing apparatus comprising:
a processing chamber configured to accommodate a substrate;
a gas supply section configured to supply a processing gas including a silicon- containing gas to the processing chamber: and
a controller,
wherein the controller configured to control the gas supply section
to supply a first processing gas to the substrate accommodated in the processing chamber to deposit a first silicon film, and
to supply a second processing gas to the substrate accommodated in the processing chamber to deposit a second silicon film,
wherein the first processing gas contains the silicon-containing gas and does not contain $H_2$ gas,
wherein the second processing gas contains both the silicon-containing gas and $H_2$ gas,
wherein by the supplying of the first processing gas, the first silicon film has a first in—plane distribution of film characteristics, and
wherein by the supplying of the second processing gas, the second silicon film has a second in-plane distribution of film characteristics different from the first in-plane distribution of film characteristics.

* * * * *